(12) United States Patent
Schulze et al.

(10) Patent No.: US 7,768,093 B2
(45) Date of Patent: Aug. 3, 2010

(54) POWER SEMICONDUCTOR DEVICE

(75) Inventors: Hans-Joachim Schulze, Ottobrunn (DE); Frank Hille, Munich (DE); Thomas Raker, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/403,808

(22) Filed: Mar. 13, 2009

(65) Prior Publication Data

US 2009/0206440 A1 Aug. 20, 2009

Related U.S. Application Data

(62) Division of application No. 11/379,492, filed on Apr. 20, 2006, now Pat. No. 7,541,660.

(51) Int. Cl.
*H01L 23/58* (2006.01)
(52) U.S. Cl. .................. 257/492; 257/493; 257/495; 257/E29.012
(58) Field of Classification Search .......... 257/492, 257/493, 495, E29.012
See application file for complete search history.

(56) References Cited

U.S. PATENT DOCUMENTS

| 5,804,864 | A | * | 9/1998 | Akiyama | 257/408 |
| 5,959,345 | A | * | 9/1999 | Fruth et al. | 257/605 |
| 6,215,168 | B1 | * | 4/2001 | Brush et al. | 257/494 |
| 2005/0212075 | A1 | * | 9/2005 | Neidig | 257/502 |

* cited by examiner

*Primary Examiner*—Trung Dang
(74) *Attorney, Agent, or Firm*—Coats & Bennett, P.L.L.C.

(57) ABSTRACT

A semiconductor device has a heavily doped substrate and an upper layer with doped silicon of a first conductivity type disposed on the substrate, the upper layer having an upper surface and including an active region that comprises a well region of a second, opposite conductivity type. An edge termination zone has a junction termination extension (JTE) region of the second conductivity type, the region having portions extending away from the well region and a number of field limiting rings of the second conductivity type disposed at the upper surface in the junction termination extension region.

20 Claims, 2 Drawing Sheets

US 7,768,093 B2

POWER SEMICONDUCTOR DEVICE

RELATED APPLICATION

This application is a divisional of pending U.S. patent application Ser. No. 11/379,492 filed on Apr. 20, 2006, the content of which is expressly incorporated herein by reference in its entirety.

TECHNICAL FIELD

The invention relates to silicon power semiconductor devices and, more particularly, to a device having improved edge termination.

BACKGROUND

Protection of device edges is an essential aspect of the design of high voltage semiconductor devices such as MOSFETs, IGBTs, MCTs, bipolar transistors, thyristors, and diodes. The edge protection, or edge termination structure, must perform the function of distributing the applied voltage over a wider region on the surface of the device than it occupies within the silicon substrate, hereby ensuring that the electric field at the surface is low enough to prevent arcing outside the silicon substrate or avalanche breakdown within the substrate near its surface.

Various edge termination techniques have been developed, including, for example, field plate (FP), described in F. Conti and M. Conti, "Surface breakdown in silicon planar diodes equipped with field plate," Solid State Electronics, Vol. 15, pp 93-105, the disclosure of which is incorporated herein by reference. Another edge termination approach is field limiting rings (FLR), described in Kao and Wolley, "High voltage planar p-n junctions," Proc. IEEE, 1965, Vol. 55, pp. 1409-1414, the disclosure of which is incorporated herein by reference. Further edge termination structures utilized junction termination extension (JTE), described in V. A. K. Temple, "Junction termination extension, a new technique for increasing avalanche breakdown voltage and controlling surface electric field in p-n junction," IEEE International Electron Devices Meeting Digest, 1977 Abstract 20.4, pp 423-426 and variable lateral doping concentration (VLD), described in R. Stengl et al., "Variation of lateral doping as a field terminator for high-voltage power devices", IEEE Trans. Electron Devices, 1986, Vol. ED-33, No. 3, pp 426-428, the disclosures of which are incorporated herein by reference.

Typically, a planar diffusion technique is used to produce a P-N junction diode, which yields a cylindrical junction. Because of the curvature at the edge of the junction it produces a greater electric field than an ideal planar junction. As a result, the breakdown voltage of a cylindrical junction diode is substantially lower than that of an ideal planar junction diode. Edge termination techniques are used to reduce the concentration of the electric field in a cylindrical junction diode.

U.S. Pat. No. 6,215,168 B1 to Brush et al., the disclosure of which is incorporated herein by reference, describes a semiconductor die that comprises a heavily doped silicon substrate and an upper layer comprising doped silicon of a first conductivity type disposed in the substrate. The upper layer includes an active region that comprises a well region of a second, opposite conductivity type and an edge termination zone comprising a junction termination extension (JTE) region that includes portions extending away from and extending beneath the well region. The JTE region is of varying dopant density, the dopant density being maximum at the point beneath the junction at the upper surface of the upper layer of the JTE region with the well region. The dopant density of the JTE region decreases in both lateral directions from its maximum point.

Finding an improved way to reduce the electric field at the junction of the active area and the JTE region of a power semiconductor device, the JTE region having a laterally constant or varying (VLD) dopant density, and thereby increasing its breakdown voltage remains a highly desirable goal.

SUMMARY

One embodiment is directed to a semiconductor device comprising a doped semiconductor substrate and an upper layer comprising doped semiconductor material of a first conductivity type disposed on the substrate. The upper layer comprises an upper surface and includes an active region with a well region of a second, opposite conductivity type and an edge termination zone that comprises a junction termination extension (JTE) region of the second conductivity type. The JTE region comprises portions extending away from the well region. A number of field limiting rings of the second conductivity type are disposed at the upper surface in the junction termination extension region.

Another embodiment is directed to a semiconductor device comprising a doped semiconductor substrate and an upper layer of semiconductor material of a first conductivity type disposed on said semiconductor substrate, said upper layer having an upper surface and including an active region that comprises a well region of a second, opposite conductivity type and an edge termination zone that comprises a first junction termination extension (JTE) region of the second conductivity type, said region comprising portions extending away from said well region, and a second junction termination extension (JTE) region of the second conductivity type extending away from said well region disposed in the first junction termination extension region.

DETAILED DESCRIPTION

Figure 1A:
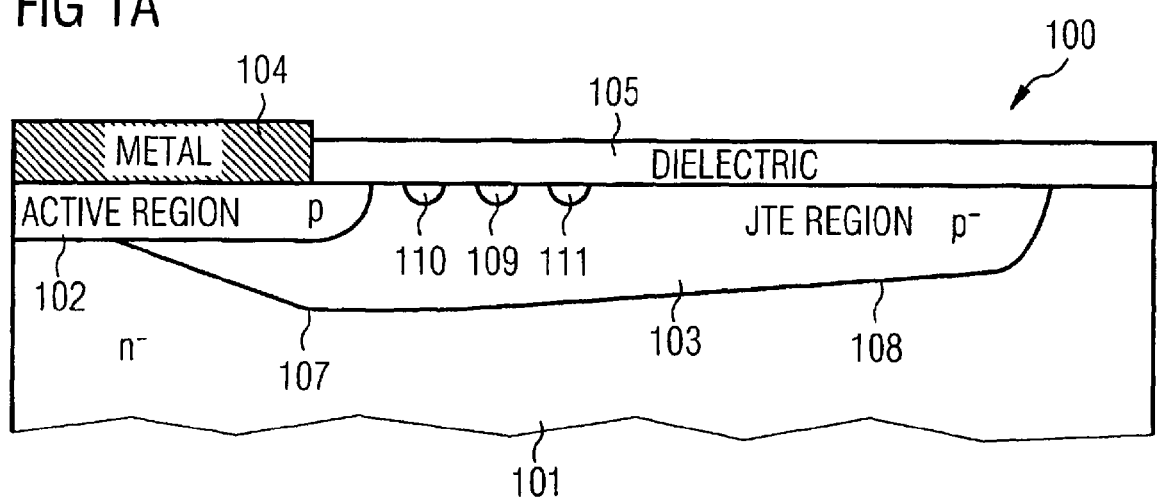
FIG. 1A shows a cross-sectional view of a semiconductor die including a JTE region as an edge termination structure according to a first embodiment of the invention.

FIG. 1A schematically depicts a semiconductor die 100 according to a first embodiment of the present invention. The semiconductor die 100 comprises an N-doped upper layer 101 which includes an active region well 102, which can be e.g. a p-emitter of a diode or a p-body of an IGBT, and a JTE region 103, which are both p-doped. The upper layer 101 further comprises a number of p-doped field limiting rings 109, 110 and 111 in the JTE region 103. A metal contact 104 and a dielectric layer 105 overlie, respectively, the active region 102 and the JTE region 103 with the field limiting rings 109. The JTE-region 103 extends deeper into the upper layer in the direction perpendicular to the upper surface than the field limiting rings 109.

It is recognized that the conductivity types of the dopants in layer 101, well 102, JTE region 103, and field limiting rings 109, 110 and III, N, P, P, and P, respectively, can also be of the opposite conductivity types, i.e., P, N, N and N, respectively.

The active region 102 and the field limiting rings 109 are preferably heavily doped with a dopant concentration of the order of $10^{18}$ cm$^{-3}$ or above, while the JTE region 103 is typically doped with a concentration of the order of $10^{15}$ cm$^{-3}$. In one embodiment of the invention, the field limiting rings 109, 110 and 111 comprise substantially the same dopant density. In another embodiment of the invention, the dopant density of the field limiting rings increases from a maximum value of the innermost field limiting ring 109 closest to the well region 102 to a minimum value of the furthermost field limiting ring 111. The field limiting rings preferably comprise substantially the same width.

From a point of maximum dopant density 107, that lies substantially directly beneath the junction of JTE region 103 with active region 102 at the upper surface of upper layer 101, the dopant density of the JTE region 103 preferably decreases in both lateral directions, forming a variation of lateral doping (VLD) region. The VLD edge termination is therefore a special case of a JTE structure.

The JTE region 103 and the field limiting rings 109, 110 and 111 of die 100 are preferably formed by implanting varying amounts of dopant according to known procedures described in, for example, U.S. Pat. Nos. 4,927,772, 4,667,393, and 4,648,174. The JTE region 103 and the field limiting rings can also comprise epitaxial layers, as described in U.S. Pat. No. 5,712,502.

In the case of an avalanche breakdown, the concentration of p-holes compensates the charge of the ionized dopants in the JTE region, thereby reducing the maximum electrical field strength in the area of the junction termination. If the p-hole concentration in the case of an avalanche breakdown exceeds the dopant concentration of the JTE region 103, this mechanism no longer works and the breakdown may jump to the edge of the active region 102.

The field limiting rings however have a dopant concentration that exceeds the concentration of p-holes in the case of a breakdown. They can therefore built up a spacecharge region that partly compensates the influence of the curved junction on the electric field and therefore increases the breakdown voltage of the semiconductor device even in the case of high leakage current densities.

Figure 1B:
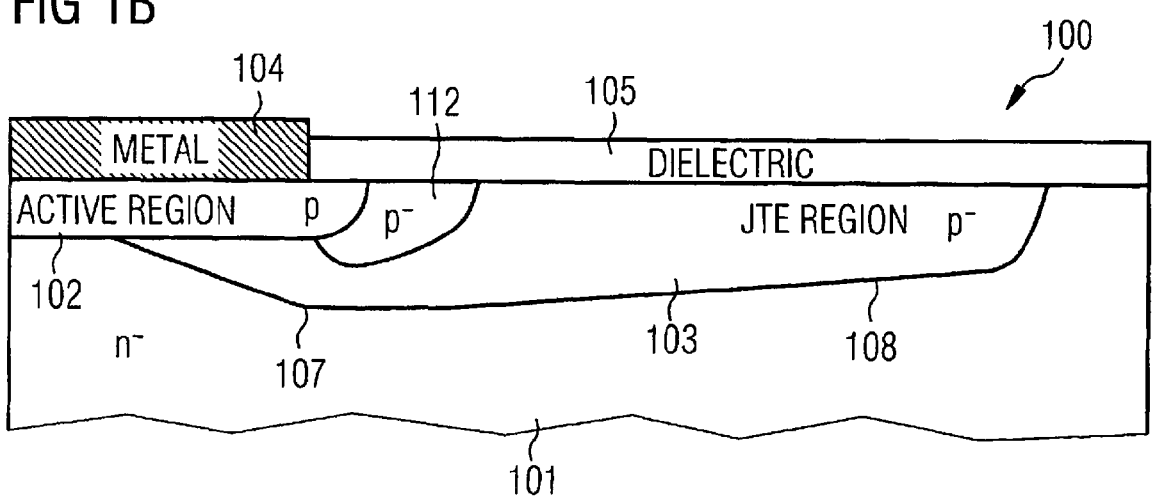
FIG. 1B shows a cross-sectional view of a semiconductor die including a JTE region as an edge termination structure according to a second embodiment of the invention.

FIG. 1B schematically depicts a semiconductor die 100 according to a second embodiment of the present invention. The semiconductor die 100 comprises an N-doped upper layer 101 which includes an active region well 102, which can be e.g. a p-emitter of a diode or a p-body of an IGBT, and a first JTE region 103, which are both p-doped. The upper layer 101 further comprises a second JTE region 112 in the first JTE region 103. A metal contact 104 and a dielectric layer 105 overlie, respectively, the active region 102 and the first and second JTE region 103 and 112.

It is recognized that the conductivity types of the dopants in layer 101, well 102, first JTE region 103, and second JTE region 112, N, P, P, and P, respectively, can also be of the opposite conductivity types, i.e., P, N, N and N, respectively.

The lateral extension of the second JTE region on the upper surface is 20 to 200 μm, depending on the desired voltage class of the device.

The first JTE region 103 is typically doped with a dose of the order $10^{12}$ cm$^{-2}$ to $5 \cdot 10^{12}$ cm$^{-2}$, while the second JTE region is doped with a dose of the order of $10^{13}$ cm$^{-2}$ to $10^{15}$ cm$^{-2}$. The first JTE region 103 and the second JTE region 112 can be of constant or varying lateral dopant density.

Figure 2:
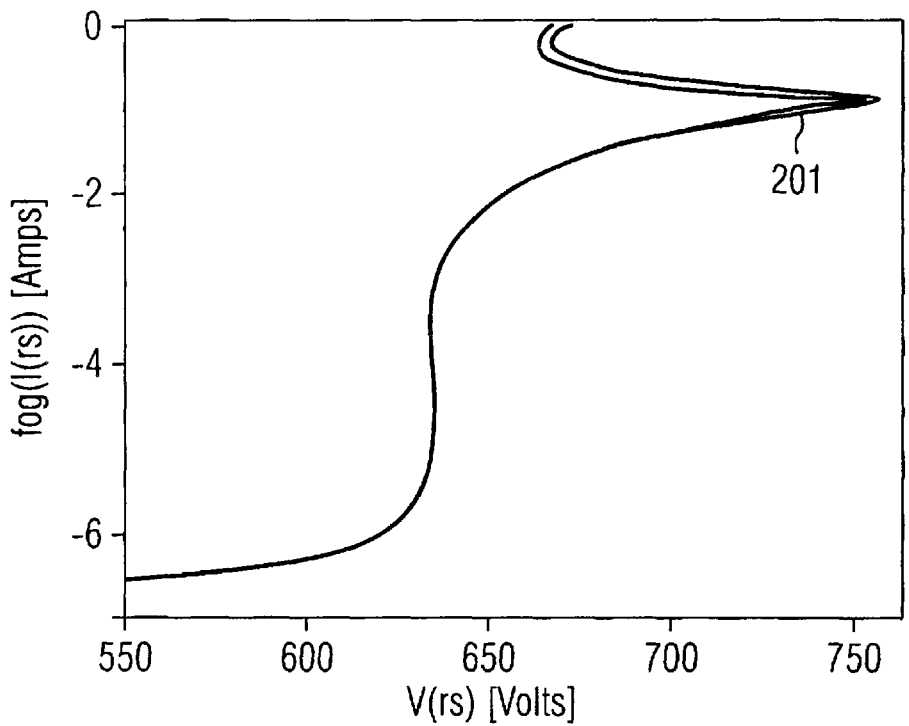
FIG. 2 shows a graph of the current-voltage-characteristic under reverse bias of a power semiconductor device with the die of FIG. 1.

FIG. 2 depicts a computer simulation of the current-voltage-characteristic under reverse bias of a power semiconductor device with field limiting rings 109 in addition to a JTE region 103. The characteristic shows a sharp voltage drop at the point 201 of an avalanche breakdown.

Figure 3:
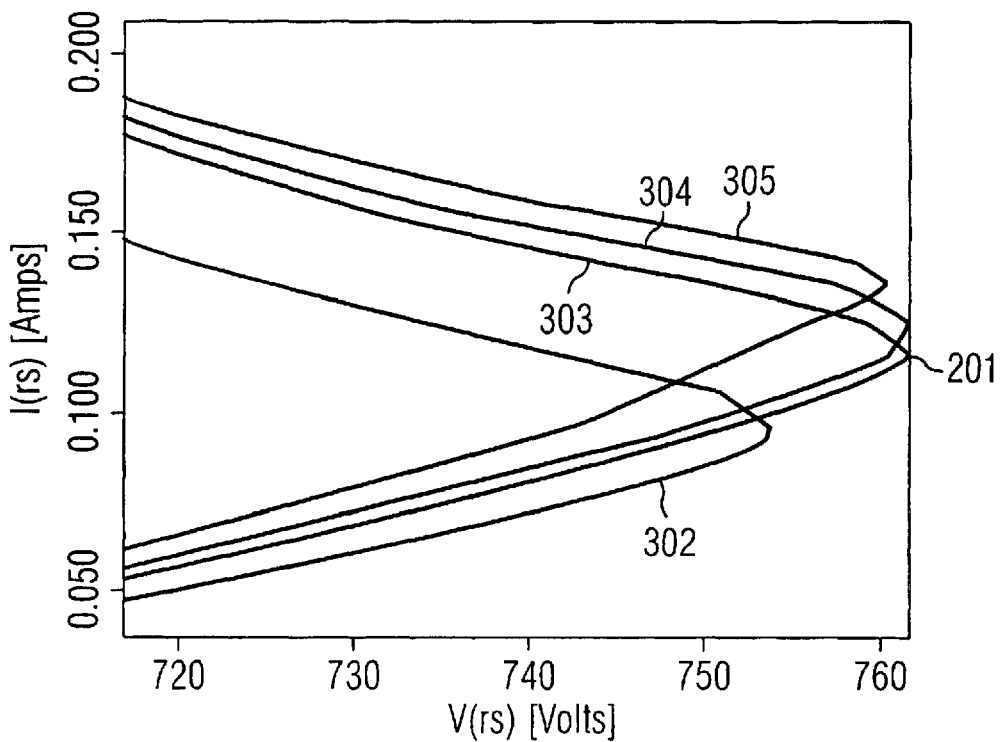
FIG. 3 shows a detail of the graph of FIG. 2.

FIG. 3 shows a detail of FIG. 2, which illustrates the influence of the number of field limiting rings 109 in the JTE region 103 on the current-voltage-characteristic. The first characteristic 302 is the characteristic of a die 100 which comprises a JTE region 103 but no field limiting rings 109. The second, third and fourth characteristic 303, 304, and 305 respectively, are the characteristics of a die 100 with a JTE junction and additional three, four or five field limiting rings 109, respectively.

The point 201 indicating a breakdown jumping of the position of the edge of the JTE to the edge of the active region is shifted to higher currents and higher voltages by employing the field limiting rings. The improvement can be achieved with a constant as well as with a varying lateral doping.

The die 100 with the edge termination according to the invention is preferably used in an IGBT-, Schottky-diode or a pin-diode semiconductor device.

While the invention has been particularly shown and described with reference to preferred embodiments thereof, it will be understood by those skilled in the art that the foregoing and other changes in form and details may be made therein without departing from the spirit and scope of the invention, which is defined by the following claims.

REFERENCE NUMBERS 100 device
101 upper layer
102 active region
103 JTE region
104 metal contact
105 dielectric layer
107 point of maximum dopant density
109 field limiting ring
110 innermost field limiting ring
111 furthermost field limiting ring
112 second JTE region
201 point of avalanche breakdown
302 first characteristic
303 second characteristic
304 third characteristic
305 fourth characteristic

What is claimed is:

1. A semiconductor device, comprising:
a doped semiconductor substrate; and
an upper layer of semiconductor material of a first conductivity type disposed on said semiconductor substrate, said upper layer having an upper surface and including an active region that comprises a well region of a second, opposite conductivity type and an edge termination zone that comprises
a first junction termination extension (JTE) region of the second conductivity type extending away from said well region; and
a second junction termination extension (JTE) region of the second conductivity type disposed in the first JTE region, said second JTE region adjoining said well region and extending away from said well region.

2. A semiconductor device according to claim 1, wherein said first JTE region comprises portions extending beneath said well region.

3. A semiconductor device according to claim 1, wherein said semiconductor substrate is a silicon substrate.

4. A semiconductor device according to claim 1, wherein said semiconductor substrate is a silicon carbide substrate.

5. A semiconductor device according to claim 1, wherein said upper layer is a silicon layer.

6. A semiconductor device according to claim 1, wherein said upper layer is a silicon carbide layer.

7. A semiconductor device according to claim 1, wherein said first conductivity type is N and said second conductivity type is P.

8. A semiconductor device according to claim 1, wherein said first conductivity type is P and said second conductivity type is N.

9. A semiconductor device according to claim 1, wherein said first JTE region is of constant lateral doping density.

10. A semiconductor device according to claim 9, wherein said second JTE region is of constant lateral doping density.

11. A semiconductor device according to claim 9, wherein said second JTE region is of varying lateral dopant density.

12. A semiconductor device according to claim 1, wherein said first JTE region is of varying lateral dopant density.

13. A semiconductor device according to claim 12, wherein said second JTE region is of constant lateral doping density.

14. A semiconductor device according to claim 12, wherein said second JTE region is of varying lateral dopant density.

15. A semiconductor device according to claim 11, wherein said first and said second JTE regions are formed by ion implantation.

16. A semiconductor device according to claim 11, wherein said first and said second JTE regions are formed by epitaxial growth.

17. A semiconductor device according to claim 11, wherein the dopant concentration of said second JTE region is higher than the dopant concentration of said first JTE region.

18. A semiconductor device according to claim 11, wherein the dopant dose of said first JTE region is of the order of $10^{12}$ cm$^{-2}$ to $5 \cdot 10^{12}$ cm$^{-2}$.

19. A semiconductor device according to claim 11, wherein the dopant dose of said second JTE region is of the order of $10^{13}$ cm$^{-2}$ to $10^{15}$ cm$^{-2}$.

20. A semiconductor device according to claim 1, wherein a dopant concentration of said second JTE region is higher than a dopant concentration of said first JTE region and lower than a dopant concentration of the well region.

* * * * *